United States Patent
Hauf et al.

(10) Patent No.: US 7,153,449 B2
(45) Date of Patent: Dec. 26, 2006

(54) ACIDIC TREATMENT LIQUID AND METHOD OF TREATING COPPER SURFACES

(75) Inventors: Uwe Hauf, Wendelstein (DE); Harry Fuerhaupter, Bellefonte, PA (US); Alexey Stiop, State College, PA (US); Udo Grieser, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 95 days.

(21) Appl. No.: 10/311,395

(22) PCT Filed: Jul. 6, 2001

(86) PCT No.: PCT/EP01/07788

§ 371 (c)(1),
(2), (4) Date: Dec. 13, 2002

(87) PCT Pub. No.: WO02/04706

PCT Pub. Date: Jan. 17, 2002

(65) Prior Publication Data

US 2003/0164466 A1    Sep. 4, 2003

(30) Foreign Application Priority Data

Jul. 7, 2000 (DE) ................. 100 34 022

(51) Int. Cl.
*C09K 13/00* (2006.01)
(52) U.S. Cl. .............. 252/79; 252/79.2; 252/79.3; 252/79.9; 216/13
(58) Field of Classification Search ........... 252/79.1, 252/79.2, 79.3, 79.4; 216/13
See application file for complete search history.

(56) References Cited

U.S. PATENT DOCUMENTS 3,770,530 A * 11/1973 Fujimoto .................. 216/50
4,715,894 A * 12/1987 Holtzman et al. ......... 106/1.22

(Continued)

FOREIGN PATENT DOCUMENTS

DE    197 32 419 A1    5/1998

(Continued)

*Primary Examiner*—Felisa Hiteshew
(74) *Attorney, Agent, or Firm*—Paul & Paul

(57) ABSTRACT

The present invention relates to a solution and to a method of treating copper surfaces, the copper surfaces being brought into contact with an acidic treatment liquid which contains hydrogen peroxide and at least one five-membered heterocyclic compound as well as additionally at least one microstructure modifying agent selected from the group comprising thioles A, disulfides B, sulfides C and thioamides D having the following respective general formulae:

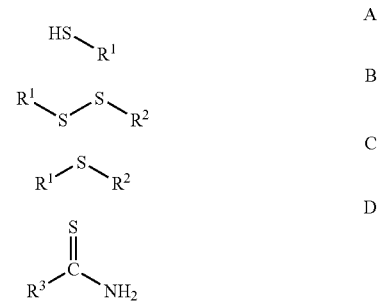

wherein $R^1$ and $R^2$=alkyl, alkenyl, aryl, aralkyl, especially benzyl, cycloalkyl and the derivatives thereof and $R^3=R^1$, $R^1$—O, $R^1$—S, amino or substituted amino, wherein $R^1$ and $R^2$ may especially be phenyl or substituted phenyl.

11 Claims, 4 Drawing Sheets

U.S. PATENT DOCUMENTS

| | | | |
|---|---|---|---|
| 4,917,758 A | 4/1990 | Ishizuka et al. | |
| 5,800,859 A | 9/1998 | Price et al. | |
| 5,807,493 A | 9/1998 | Maki et al. | |
| 5,958,147 A * | 9/1999 | Berglind et al. | 134/3 |
| 6,020,029 A * | 2/2000 | Ferrier et al. | 427/333 |
| 6,106,899 A * | 8/2000 | Nakagawa et al. | 427/327 |
| 6,117,250 A | 9/2000 | Schemenaur et al. | |
| 6,506,314 B1 * | 1/2003 | Whitney et al. | 216/100 |

FOREIGN PATENT DOCUMENTS

| | | |
|---|---|---|
| DE | 198 30 038 A1 | 6/1998 |
| DE | 198 30 037 A1 | 8/1999 |
| DE | 199 26 117 A1 | 12/1999 |
| EP | 0 252 295 | 6/1987 |
| EP | 0 890 660 A1 | 1/1999 |
| EP | 0 926 265 A1 | 6/1999 |
| EP | 1 031 644 A1 | 8/2000 |
| JP | 409170094 A * | 6/1997 |
| JP | 2001026898 A * | 1/2001 |
| WO | WO 96/19097 | 6/1996 |
| WO | WO 99/40764 | 8/1999 |

* cited by examiner

ACIDIC TREATMENT LIQUID AND METHOD OF TREATING COPPER SURFACES

CROSS-REFERENCE TO RELATED APPLICATIONS

This application is filed under 35 U.S.C. 371 and is the National Stage of International Application No. PCT/EP01/07788 filed on Jul. 6, 2001 which claims priority to German Patent Application DE10043022.9 filed Jul. 7, 2000.

BACKGROUD OF THE INVENTION

The invention relates to an acidic treatment liquid and to a method of treating copper surfaces, especially of forming copper surfaces on printed circuit boards, the copper surfaces being suitable for the subsequent coating with plating resists, etch resists, solder masks and other dielectric films and further to copper substrates having roughened surfaces.

In the manufacture of printed circuit boards copper surfaces are coated with various organic films, such as for example etch resists, plating resists, solder masks and other dielectric materials. These films can be applied to the board surfaces as a liquid or as a dry film resist. In any case good adhesion of the film to be applied to the surfaces is necessary. In some cases the film shall remain permanently on the surfaces after it has been applied thereto, for example in the case of a solder mask. In this case a tight bond to the copper surfaces is required since the mask shall protect certain areas of the copper surfaces prior to a contact with molten solder during the soldering process or prior to a treatment with corrosive chemicals which come into contact with the uncoated areas before metal layers are deposited for example. In other cases the film shall remain on the copper surfaces only temporarily, for example if an etch resist is used. Good adhesion is required in this case too because these resists shall protect certain areas of the copper surfaces against an attack from corrosive chemicals which serve to remove copper areas being exposed by etching. After the resist has been etched it is removed again. Both in the cases in which the film permanently remains on the copper surfaces and in the cases in which it is deposited merely temporarily good adhesion of the organic film is required in order to prevent etching off or flaking thereof from the surfaces.

A common method of improving adhesion of an organic film on a smooth copper surface consists in roughening the surfaces. This may either be carried out by mechanical means, for example by grinding or by treatment of the surface with a slurry of pumice in water. The surfaces may as well be roughened by chemical means, for example by microetching with solutions of persulfates or with solutions of hydrogen peroxide and sulfuric acid.

The aforementioned roughening methods have proven problematical in that the organic films do not have sufficient adhesion to the copper surfaces if they are deposited to the copper surfaces of very narrow conductor lines and to extremely fine solder pads or bond pads.

In order to solve this problem a method of microetching of copper surfaces is described in U.S. Pat. No. 5,807,493, the method comprising bringing an etching composition into contact with the copper surfaces. The etching composition contains copper(II) ions, an organic acid having a dissociation constant ($pK_a$) of at most 5, especially certain carboxylic acids, such as for example formic acid, acetic acid or propionic acid, a halide ion source, such as for example hydrochloric acid, hydrobromic acid and the alkali salts thereof, as well as water. If this etching composition is used a considerable part of the copper layers are to be removed from the printed circuit boards in order to guarantee sufficient adhesion. For example typically 15 to 18% (corresponds to 2.5–3 microns) are removed by etching from a 17 microns thick copper layer.

An aqueous microetching solution for copper and copper alloys is disclosed in EP 0 890 660 A1, the solution containing 1–50% by weight sulfuric acid, 0.1–20% by weight hydrogen peroxide and 0.0001–3% by weight tetrazole or the derivatives thereof.

A method of manufacturing a printed circuit board substrate coated with thin copper layers is described in U.S. Pat. No. 4,917,758, the method comprising etching the copper layers with a solution containing hydrogen peroxide, sulfuric acid and copper(II) chloride. The etching method is designed such that 0.01–0.3 microns copper are removed per second. In total 20–90% of the layer is removed by etching. Thereafter the copper layers are post-treated with a solution containing benzotriazole for example.

A liquid etching means is described in DE 199 26 117 A1 the means containing halides as well as tetrazoles and/or triazoles in addition to hydrogen peroxide or any other peroxide as well as sulfuric acid, phosphoric acid or any other inorganic acid. The copper surfaces etched with this etching means are dark, especially brown. In further processing of the printed circuit boards treated in this manner this leads to a reduction of contrast in color between copper and the epoxy resin substrate, visual alignment of a photomask on the conductor line pattern being rendered very difficult if the alignment marks are formed by the copper surface. An etching means is also disclosed in DE 197 32 419 A1 this means however containing no tetrazole but instead benzotriazole as an auxiliary component.

Furthermore a method of treating metal surfaces, especially copper surfaces, for enhancing adhesion of the copper surfaces to epoxy resin composite materials, especially so-called prepregs, i.e. epoxy resin being reinforced by glass fiber mats, is disclosed in U.S. Pat. No. 5,800,859. The composition used for this treatment contains 0.1–20% by weight hydrogen peroxide, an inorganic acid, especially phosphoric acid, nitric acid, sulfuric acid or the mixtures thereof, a corrosion inhibitor, especially a triazole, tetrazole or imidazole, and a wetting agent, especially a cationic wetting agent. Copper is dissolved by the action of the composition on the copper surfaces. According to U.S. Pat. No. 5,800,859 the copper dissolved reacts with the inhibitor components and forms a film on the copper surfaces.

A method of treating metal surfaces, especially copper surfaces, is disclosed in WO 96/19097 A1, the method comprising bringing the metal surfaces into contact with a composition containing 0.1–20% by weight hydrogen peroxide, an inorganic acid, especially phosphoric acid, nitric acid, sulfuric acid or a mixture of these acids, as well as an organic corrosion inhibitor, especially a triazole, tetrazole and/or imidazole.

A solution and a method of pretreating copper surfaces for subsequently forming an adherent bond between the copper surfaces and plastics substrates is described in DE 198 30 038 A1. The solution used for carrying out this method contains hydrogen peroxide, at least one acid, especially sulfuric acid, at least one nitrogen containing heterocyclic compound, especially triazoles, tetrazoles, imidazoles, pyrazoles and purines, as well as at least one adhesion-promoting compound. Sulfinic acids, selenic acids and telluric acids, heterocyclic compounds, having at least one sulfur, selenium or tellurium atom in the heterocycle, as well as sulfonium, selenonium and telluronium salts have been proposed as the adhesion-promoting compounds. Above all thiophenes, thiazoles, isothiazoles, thiadiazoles and thiatriazoles are a possibility as the heterocyclic adhesion-promoting compounds.

A method of pretreating copper surfaces for the subsequent formation of a tight bond between the copper surfaces and plastics substrates is described in DE 198 30 037 A1, the method comprising bringing the copper surfaces into contact first with a solution containing the components contained in the solution according to DE 198 30 038 A1 with the exception of the adhesion-promoting compounds. Thereafter the copper surfaces are treated with a second solution containing the adhesion-promoting compounds.

On carrying out the aforementioned methods it has been observed in part that problems arise when the copper surfaces, exposed again after organic films had been applied thereto, are chemically treated, for example when tin, silver, nickel, gold or palladium are deposited in an electroless manner or when organic protective layers are applied prior to soldering. These problems in part consist in that deposition of the metals mentioned could not be achieved at all and in part that just a very uneven deposition was formed, and the problems arise if the copper surfaces have been pretreated with the etching means prior to applying the organic film.

Using conventional methods and treatment solutions it is therefore not possible to fulfill the following requirements simultaneously:

a. Sufficiently high adhesion of the organic film also on very narrow conductor lines and extremely fine solder pads and bond pads on a printed circuit board. This is required to prevent flaking or any other taking off of the organic films upon mechanical, chemical and/or thermal strain.

b. Very small etching off of copper from the surfaces, for example by 10% or less, i.e. by 1.7 microns from a copper foil having a thickness of 17 microns. Such small etching off of copper is required to be able to manufacture impedance-controlled printed circuit boards.

c. Further processing of the copper areas not coated by the organic film using further chemical methods without any difficulties, for example if metal layers are deposited or other protective layers are applied.

d. Light copper color of the copper surfaces prior to applying the organic film.

The problem underlying the present invention therefore comprises avoiding the disadvantages mentioned of the conventional solutions and methods.

SUMMARY OF THE INVENTION

According to a first aspect the present invention comprises a novel acidic liquid for treating copper surfaces.

According to another aspect the present invention comprises a novel method of treating copper surfaces.

According to a further aspect the present invention relates to the use of the novel treatment liquid for forming copper surfaces on printed circuit boards, the copper surfaces being suitable for the subsequent coating with plating resists, etch resists, solder masks and other dielectric films.

According to still another aspect the present invention comprises copper substrates having roughened surfaces with two structural dimensions.

DETAILED DESCRIPTION OF THE INVENTION

Figure 1:
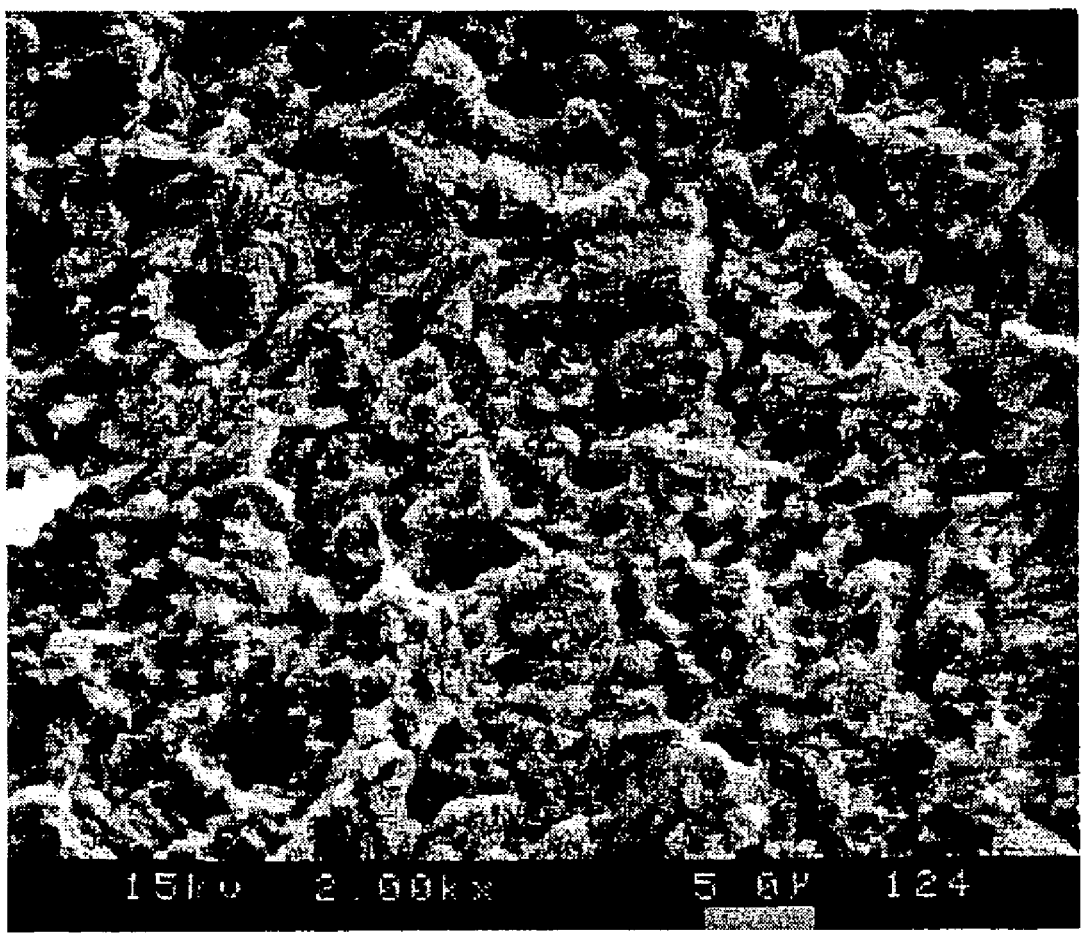
FIG. 1 is a photo of a copper surface treated by a first aqueous treatment solution according to the present invention as described in Example 1 having semicrystalline structures at a magnification of about 2,000 times.

The method according to the present invention serves to treat copper surfaces, especially on printed circuit boards. The acidic treatment liquid preferably serves to form copper surfaces on printed circuit boards, the copper surfaces being suitable for the subsequent coating with plating resists, etch resists, solder masks and other dielectric films. The acidic treatment liquid according to the present invention, preferably being aqueous, contains a. hydrogen peroxide and
b. at least one five-membered heterocyclic compound.

The acidic treatment liquid according to the present invention additionally contains c. at least one microstructure modifying agent, selected from the group comprising organic thiols preferably having the general formula

A organic disulfides preferably having the general formula

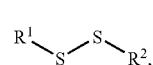

B organic sulfides preferably having the general formula

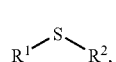

C and thioamides preferably having the general formula

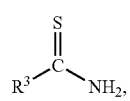

D wherein

R$^1$ and R$^2$=alkyl, alkenyl, aryl, aralkyl, especially benzyl, cycloalkyl and the derivatives thereof, wherein R$^1$ and R$^2$ may be identical or different, R$^3$=R$^1$, R$^1$—O, R$^1$—S, amino or substituted amino, wherein R$^1$ and R$^2$ may be phenyl or substituted phenyl.

Alkyl is preferably C$_1$–C$_{20}$ alkyl, more preferably C$_1$–C$_{10}$ alkyl and most preferably C$_1$–C$_6$ alkyl, i.e. methyl, ethyl, propyl, butyl, pentyl and hexyl as being most preferred, wherein all isomers are included, i.e. n-propyl, iso-propyl, n-butyl, iso-butyl, tert-butyl, n-pentyl, iso-pentyl, tert-pentyl, neo-pentyl etc. This definition is also to be applied to alkyl groups in definitions given hereinafter.

Derivatives of the alkyl groups are preferably hydroxylated alkyl groups. Examples of the hydroxylated alkyl groups are 1-hydroxyethyl, 2-hydroxyethyl, 1-hydroxypropyl, 2-hydroxypropyl, 3-hydroxypropyl, 1,2-dihydroxyethyl, 1,2-dihydroxypropyl, 1,3-dihydroxypropyl, 2,3-dihydroxypropyl, 1,2,3-trihydroxypropyl etc. This definition is also to be applied to hydroxy groups in definitions given hereinafter. Derivatives of the alkyl groups may also be the alkoxylated alkyl groups, such as e.g. 1-methoxyethyl, 2-methoxyethyl, 1-methoxypropyl, 2-methoxypropyl, 3-methoxypropyl, 1,2-dimethoxyethyl, 1,2-dimethoxypropyl, 1,3-dimethoxypropyl, 2,3-dimethoxypropyl, 1,2,3-trimethoxypropyl etc. as well as the corresponding ethoxy and propoxy analogues. This definition is also to be applied to alkoxy groups in definitions given hereinafter. Derivatives of the alkyl groups may also be the corresponding cyano compounds, nitro compounds, amido compounds, sulfinyl compounds, sulfonyl compounds and sulfonyl amido compounds.

Aryl is preferably phenyl, naphthyl, anthracenyl and phenanthryl and most preferably phenyl. Derivatives of the aryl groups are preferably alkyl derivatives, i.e. mono-, di- and tri-substituted alkyl derivatives, the definition of the alkyl groups as given above, further derivatives with preferably one, two or three hydroxy groups, the definition of the hydroxy derivatives as given above, further derivatives with preferably one, two or three alkoxy groups, the definition of the alkoxy groups as given above, further with preferably one, two or three nitro groups as well as derivatives in which more than one type of substituents given above are bonded to the aryl groups, i.e. alkyl groups together with hydroxy groups and/or alkoxy groups and/or nitro groups or hydroxy groups together with alkoxy groups and/or nitro groups or alkoxyl groups together with nitro groups and further the corresponding cyano compounds, nitro compounds, amido compounds, sulfinyl compounds, sulfonyl compounds and sulfonyl amido compounds. The respective substituents may be in any of the positions in the aryl skeleton, e.g. in 2-, 3-, 4-, 5-and 6-position of a phenyl ring, if the phenyl ring is bonded to the sulfur atom in 1-position.

Aralkyl is an aryl group bonded to an alkylen group, the aralkyl group in this case being bonded to the sulfur atom via the alkylen group, or an alkyl group bonded to an arylen group, the aralkyl group in this case being bonded to the sulfur atom via the arylen group. The alkyl group is defined as given above and the alkylen group has the corresponding meaning, e.g. n-propyl corresponds to n-propylene. The aryl group is defined as given above as well and the arylene group has the corresponding meaning, e.g. phenyl corresponds to phenylene. Derivatives of the aralkyl groups are preferably compounds which comprise derivatives of the alkyl or alkylene groups, respectively, as given above, the respective substituents being bonded to the alkyl or alkylene group, respectively, and/or to the aryl or arylene group, respectively.

Cycloalkyl is preferably a C$_{3-7}$ cycloalkyl group, i.e. a cyclopropyl, cyclobutyl, cyclopentyl, cyclohexyl or cycloheptyl group, and most preferably a cyclohexyl group. Derivatives of the cycloalkyl groups are preferably alkyl derivatives, i.e. mono-, di- and tri-substituted alkyl derivatives, the definition of the alkyl groups being as given above, further derivatives with preferably one, two or three hydroxy groups, the definition of the hydroxy groups being as given above, further derivatives with preferably one, two or three alkoxy groups, the definition of the alkoxy groups being as given above, further with preferably one, two or three nitro groups and further the corresponding cyano compounds, amido compounds, sulfinyl compounds, sulfonyl compounds and sulfonyl amido compounds. There are also comprised derivatives in which more than one type of substituents as given above are bonded to the cycloalkyl groups, e.g. alkyl groups together with hydroxy groups and/or alkoxy groups and/or nitro groups or hydroxy groups together with alkoxy groups and/or nitro groups or alkoxy groups together with nitro groups. The respective substituents may be in any of the positions in the cycloalkyl skeleton, e.g. in 2-, 3-, 4-, 5-and 6-position of a cyclohexyl ring, if the cyclohexyl ring is bonded to the sulfur atom in 1-position.

R$^1$ and R$^2$ preferably contain one or more functional groups mediating the solubility of the microstructure modifying agent in an aqueous solution, for example a group selected from the group comprising amino, carboxy (COOH) and sulfo (SO$_3$H) and the protonated (NH$_3^+$, NRH$_2^+$, NRR'H$^+$) or deprotonated derivatives thereof (COO$^-$, SO$_3^-$), respectively. The amino group may be any of an unsubstituted (NH$_2$), mono- (NHR, wherein R is preferably alkyl as defined above) or disubstituted amino group (NRR', wherein R and R' are preferably alkyl as defined above and are selected independently). The position of the functional groups in R$^1$ and R$^2$ may be any. These functional groups may be contained in R$^1$ and R$^2$ in addition to the substituents as given above.

As far as R$^3$ is substituted amino this moiety preferably comprises groups such as e.g. alkyl and dialkyl amino groups, alkyl being defined as above.

As far as R$^3$ is substituted phenyl this moiety preferably comprises groups in which phenyl is substituted with one, two or three alkyl groups, the alkyl groups being defined as above, further groups in which phenyl is substituted with one, two or three hydroxy groups as defined above, further groups in which phenyl is substituted with one, two or three alkoxy groups as defined above, further groups in which phenyl is substituted with one, two or three nitro groups as well as groups in which phenyl is substituted with more than one type of substituents as given above as well as groups in which phenyl is substituted with cyano, nitro, amido, sulfinyl, sulfonyl and/or sulfonyl amido moieties.

The five-membered heterocyclic compounds are preferably selected from the group comprising tetrazoles and the derivatives thereof, especially preferred comprising 5-aminotetrazole and 5-phenyltetrazole.

The microstructure modifying agents are preferably selected from the group comprising L-cysteine, DL-cysteine, 2-aminoethanethiol (cysteamine), mercaptoacetic acid (thioglycolic acid), 3-mercaptopropionic acid, 2-mercaptoethanesulfonic acid and 3-mercaptopropanesulfonic acid as thiols (type A compounds), further L-cystine, DL-cystine, D-cystine and bis-(2-aminoethyl) disulfide (cystamine), dithiodiacetic acid, 3,3'-dithiodipropionic acid, 4,4'-dithiodibutyric acid, 3,3'-dithio-bis-(propanesulfonic acid) as disulfides (type B compounds), further thiodiacetic acid, 3,3'-thiodipropionic acid and 3,3'-thio-bis-(propanesulfonic acid) as sulfides (type C compounds) as well as thiourea and thiobenzamide as thioamides (type D compounds) as well as the salts of the aforementioned compounds as far as these compounds are acids and amines.

In general in addition to the components mentioned the acidic treatment liquid according to the present invention contains an acid. The liquid preferably contains an inorganic acid, especially sulfuric acid. It may also contain any other acid.

The method according to the present invention is simple and cheap and may be easily carried out. The method is carried out by means of galvanochemical methods after the copper structures on printed circuit boards have been formed by bringing the copper surfaces into contact with the treatment liquid. An additional cleaning step prior to carrying out the method according to the invention may be performed in order to remove impurities from the copper surfaces and in order to guarantee even treatment.

The problems encountered if conventional means are used can be eliminated if the treatment liquid according to the present invention is used. Especially the adhesion of organic films being subsequently applied to the copper surfaces may be improved. For this purpose a small etching off of copper is required only, the copper thickness therefore varying only in a narrow range after the etching process has been carried out. For this reason impedance-controlled printed circuit boards may be manufactured. Furthermore the light color of copper is conserved during the treatment. Therefore problems encountered during alignment of a photomask on the conductor line pattern do not occur. Disadvantageous effects due to further processing of the copper surfaces exposed after the organic film has been removed, for example due to electroless plating of tin, silver, nickel, gold or palladium or due to depositing organic protective coatings prior to soldering, have not been observed.

It has proven that a high adhesion of the organic films to the copper surfaces can be achieved even after a small etching off of copper if a certain copper structure is formed during the etching method. If the conventional mechanical roughening techniques of grinding or pumicing as well as if conventional chemical etching methods using solutions, simply containing hydrogen peroxide and sulfuric acid, are applied, surface structures on the copper surfaces are formed due to roughening which are too large or too even, so that adhesion of very narrow conductor lines and extremely fine solder pads and bond pads is not sufficiently high to exclude lifting off or flaking of the film due to mechanical, chemical or thermal strain. Very fine microstructures are formed on the copper surfaces if the etching means according to the present invention is used, the microstructures guaranteeing high adhesion. High adhesion may in fact also be achieved if a few of the aforementioned chemical etching means is used which contain hydrogen peroxide and an inorganic acid. However, in general very rough surfaces are generated. For example it has proven that deep cracks (depth of 1–5 microns) are formed in the copper surfaces if the method described in EP 0 890 660 A1 is applied. On the contrary the structures on the copper surfaces obtainable with the method according to the present invention have two orders of irregularities having different structural dimensions: On the one hand semicrystalline structures are formed which—dependent on the crystallite size in the copper surfaces—have an average size in the range of from 1–10 microns. If the copper surfaces would exclusively have structural dimensions of this size adhesion of the films would not be sufficiently high on the surfaces. On the other hand pits and dendritic structures are generated due to the use of the microstructure modifying agents according to the present invention the pits and dendritic structures having an average size in the range of from 50–500 nanometers and superponing the semicrystalline structures. The average sizes of the two types of irregularities are structure widths in the copper surfaces that are averaged over an area of 1 micron×1 micron (1 $\mu m^2$). As the structure widths the widths of individual peaks and valleys are determined by evaluating SEM (Scanning Electron Microscope) photographs.

Furthermore if conventional methods are used considerable etching off of copper takes place. In contrast thereto it is not necessary to etch off more than 1.5 microns of copper, preferably not more than 1.0 micron, if the method according to the present invention is applied in order to guarantee sufficiently high adhesion of the organic films to the copper surfaces. This property of the treatment liquid according to the present invention is of exceptional importance if electric circuits having smaller and smaller size of the conductor lines as well as of the solder pads and bond pads are to be manufactured. Due to the minor etching off of copper manufacture of impedence-controlled circuits is made possible for which conductor line cross-section must be be kept within a narrow range of tolerance.

Besides it has been observed that the copper surfaces darken if any of a plurality of conventional chemical etching methods is applied so that safe alignment of a photomask with respect to the conductor pattern is no longer possible. If the treatment liquid according to the present invention is used a mat, light and copper-colored copper surface is formed. Alignment may therefore easily be carried out since alignment is facilitated considerably due to the high contrast between the light copper surfaces and the substrate surface.

Subsequent chemical treatment of copper surfaces exposed again after organic films had been applied thereto is possible without loss of production safety if the method according to the invention is used as opposed to conventional methods. If the conventional methods are used problems encounter frequently, for example when tin, silver, nickel, gold or palladium are deposited in an electroless manner or when organic protective coatings are applied prior to soldering. These problems in part consist in that deposition of the metals mentioned cannot be achieved at all and in part consist in that just very uneven deposition is achieved. The problems further arise if the copper surfaces are pretreated with the etching means prior to depositing the organic film. These problems may possibly be ascribed to the presence of triazoles. The reason of problems arising if the exposed copper surfaces are chemically further processed is probably a thin layer of adsorbed triazoles or any other organic compound on the treated copper surfaces if conventional etching means are used. A thin adsorption layer possibly formed due to application of the method according to the present invention can however be removed easily by means of alkaline or acidic cleaning solutions usually used in printed circuit board manufacturing processes. Because of that a subsequent metallization method, for example a method for electroless plating of tin, silver or nickel/gold or a soldering method using a slightly acidic fluxing agent, may be carried without any difficulties.

The copper surfaces are first cleaned prior to the treatment with the liquid according to the present invention in order to remove impurities from the copper surface which could impair the treatment. All conventional cleaning agents can be used. Usually surface active agents and if possible also complexing agents, such as for example triethanolamine, are added to the aqueous cleaning solutions in order to achieve an improved cleaning action.

After the copper surfaces have been rinsed they are treated with the liquid according to the invention. The microetching effect of the liquid results from the combination of hydrogen peroxide and the acid. The unique microstructure is obtainable due to the use of the tetrazole compounds in combination with the microstructure modifying agent by modifying the microetching effect brought about solely by the combination of hydrogen peroxide and the acid.

Stabilization of the hydrogen peroxide solution is achieved by addition of further compounds, for example by addition of lower alcohols, such as of 1,4-butanediol and 1-propanol, further by addition of 4-hydroxybenzenesulfonic acid and 8-hydroxyquinoline. Therefore preferably these compounds are contained in the liquid.

Further components of the liquid according to the invention are further organic solvents, such as alcohols, which may be included in order to raise the solubility of the tetrazoles and of the microstructure modifying agents as solubilizers. Additionally further organic and inorganic components may be contained, for example copper sulfate and surfactants.

The method according to the present invention is preferably carried out at a temperature of from 20–60° C. The treatment time preferably amounts to 10–600 seconds. The higher the temperature of the liquid during the etching treatment the faster is the etching reaction. Therefore in this case a shorter treatment time is required if a certain etching results is to be obtained. Due to technical reasons an etching temperature in the range of from 30–40° C. is preferred in order to keep the method easier controllable. In general a temperature is set in the range of from 20–60 seconds.

The concentrations of the main components of the liquid according to the present invention are as follows:

| | |
|---|---|
| hydrogen peroxide, 30% by weight | 1–100 g/L |
| sulfuric acid, conc. | 10–250 g/L |
| tetrazole compounds | 0.1–20 g/L |
| microstructure modifying agents | 0.01–10 g/L |

The optimum concentrations of the components in the liquid depend on the type of tetrazole compounds and microstructure modifying agents used.

After having treated the copper surfaces with the treatment liquid according to the present invention they are rinsed, preferably with warm and deionized water. Thereafter they are dried in an appropriate manner, for example with hot air.

It is also possible to further treat the surface before drying by exposing the surface to an acidic or alkaline rinsing solution, which is common in the industry. Thereafter the surface is rinsed with water.

Afterwards the organic film can be deposited to the copper surfaces pretreated in the aforementioned manner.

The liquid is prepared shortly before the application thereof in order to maximize its durability. For example first a concentrated aqueous solution of sulfuric acid, tetrazole compounds and microstructure modifying agents can be prepared. This solution has a sufficiently long shelf life. Short before the use thereof the solution is added to water together with hydrogen peroxide in an amount which is just sufficient to adjust the desired individual concentrations.

The printed circuit boards can be treated in conventional dipping bath containers. It is preferable however to use conveyorized plants, the printed circuit boards being conveyed therethrough in a horizontal direction and being held in a horizontal or vertical position or in any other orientation. In the plants the printed circuit boards are brought into contact with the treatment solutions by conveying them through medium-isolated rooms the treatment solution being sprayed or swelled to the copper surfaces or the printed circuit boards being submersed in the treatment solutions. For example conveyorized plants of this type are manufactured by Atotech Deutschland GmbH, DE, Feucht.

The following examples serve to more detailedly explain the invention.

EXAMPLE 1

An aqueous solution according to the present invention was prepared by mixing the following components:

| | |
|---|---|
| sulfuric acid, 96% by weight | 50 ml |
| hydrogen peroxide, 35% by weight | 35 ml |
| 5-aminotetrazole | 2 g |
| L-cystine | 0.1 g |
| Add up with deionized water to 1 liter. | |

The solution was heated to 35° C. A printed circuit board, which had been plated by means of a bright copper bath (for example CUPRACID® BL-CT, sulfuric acid copper bath of Atotech Deutschland GmbH) preferably developped for the manufacture of printed circuit boards, was dipped into the solution according to the invention for 60 seconds. After treatment the copper surfaces were rinsed with warm deionized water and then dried with hot air. The copper surface obtained was mat and had a light pink color. The thickness of the copper layer etched off by means of the solution amounted to 0.9 microns. The microstructure of the copper surface exhibited two different structural (lateral) dimensions; (1) On the one hand semicrystalline structures were formed which had structures in the range of from 2–5 microns. (2) On the other hand pits and dendritic structures with a size of from 50–500 nanometers were formed, the pits and dendritic structures superponing the semicrystalline structures.

Figure 2:
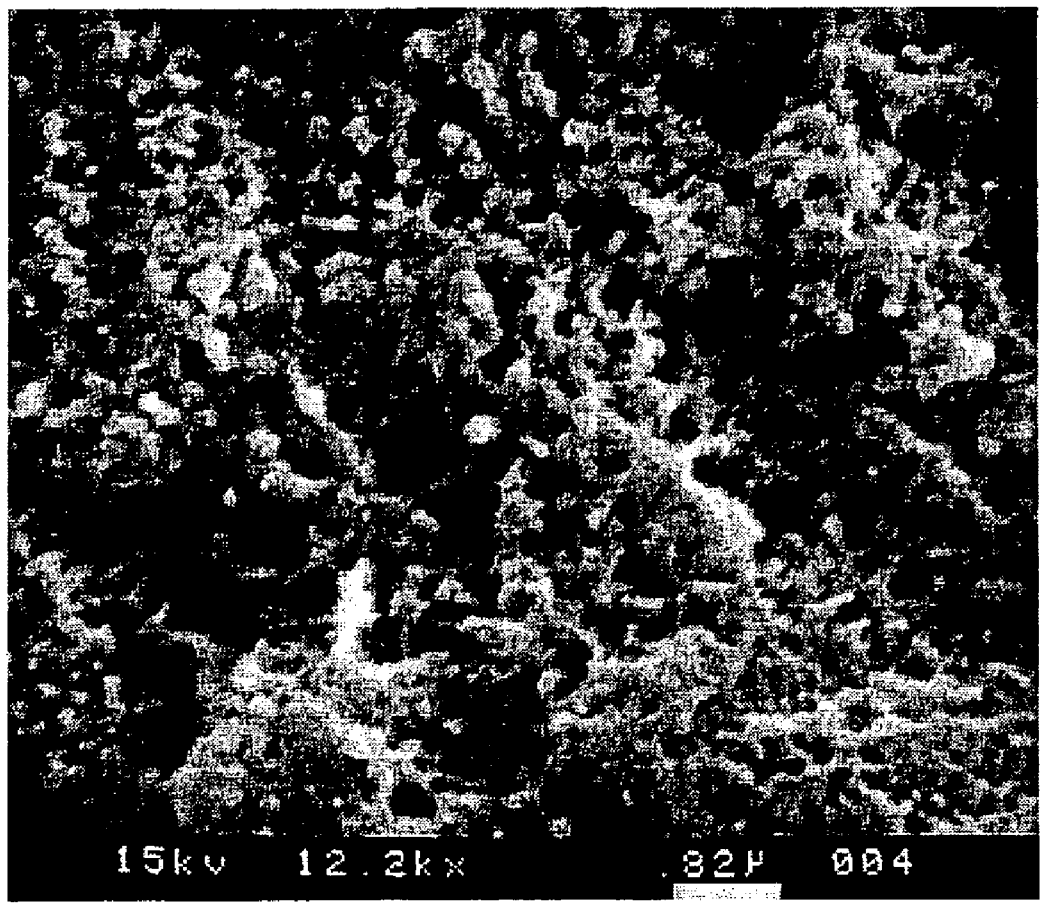
FIG. 2 is a photo of a copper surface treated by a first aqueous treatment solution according to the present invention as described in Example 1 having pots and dendritic structures at a magnification of about 12,500 times.

The semicrystalline structures are shown in FIG. 1 at a magnification of about 2,000 (1 cm corresponds to 5 microns). The pits and dendritic structures are shown in FIG. 2 at a magnification of about 12,500 (1 cm corresponds to 0.8 microns).

EXAMPLE 2

An aqueous treatment solution according to the present invention was prepared by mixing the following components:

| | |
|---|---|
| sulfuric acid, 96% by weight | 50 ml |
| hydrogen peroxide, 35% by weight | 35 ml |
| 5-aminotetrazole | 2 g |
| thiobenzamide | 0.05 g |
| Add up with deionized water to 1 liter. | |

The solution was heated to 35° C. for carrying out the method. A copper substrate which was prepared using CUPRACID® BL-CT was dipped into the solution for 50 seconds. After treatment the copper surfaces were rinsed with warm deionized water and then dried with hot air. The copper surface obtained was mat and had a light pink color. The thickness of the copper layer etched off by means of the solution amounted to 0.8 microns. The microstructure of the copper surface again exhibited two different structural (lateral) dimensions; (1) On the one hand semicrystalline structures were formed which had a structural size in the range of from 1–7 microns. (2) On the other hand pits and dendritic structures with a size of from 100–200 nanometers were formed, the pits and dendritic structures superponing the semicrystalline structures.

Figure 3:
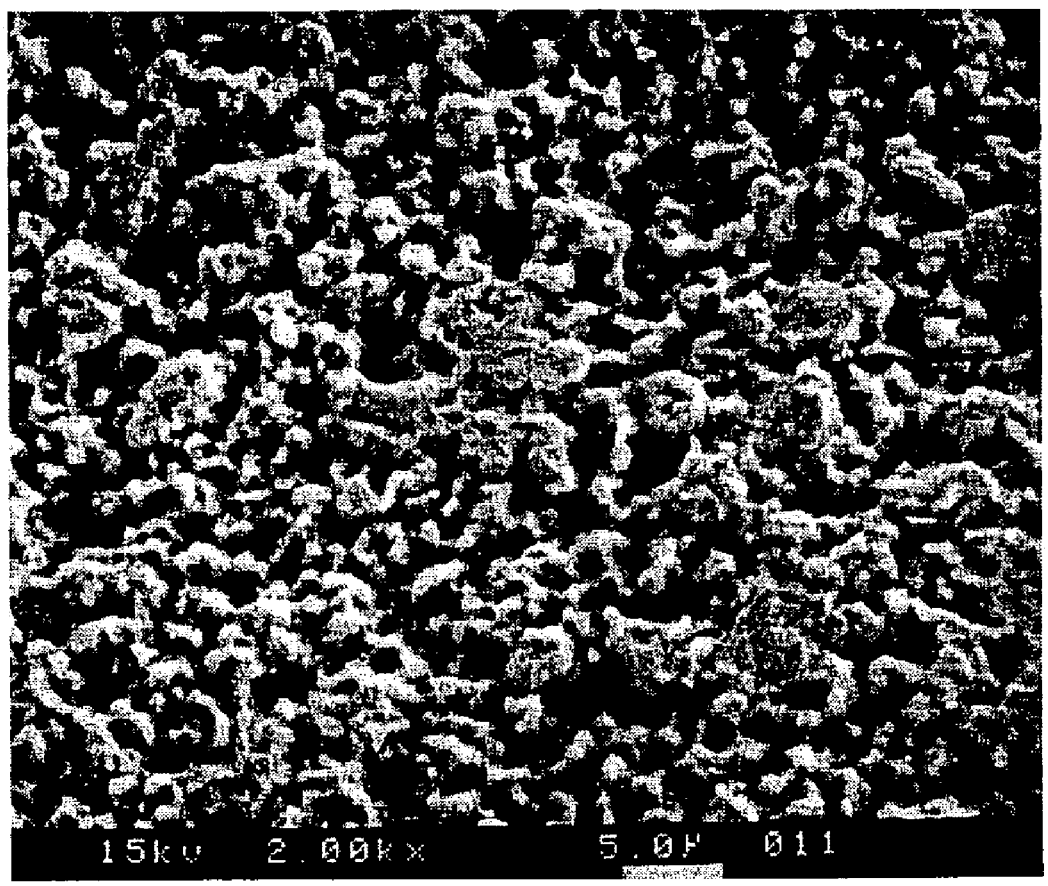
FIG. 3 is a photo of a copper surface treated by a first aqueous treatment solution according to the present invention as described in Example 2 having semicrystalline structures at a magnification of about 2,000 times.
Figure 4:
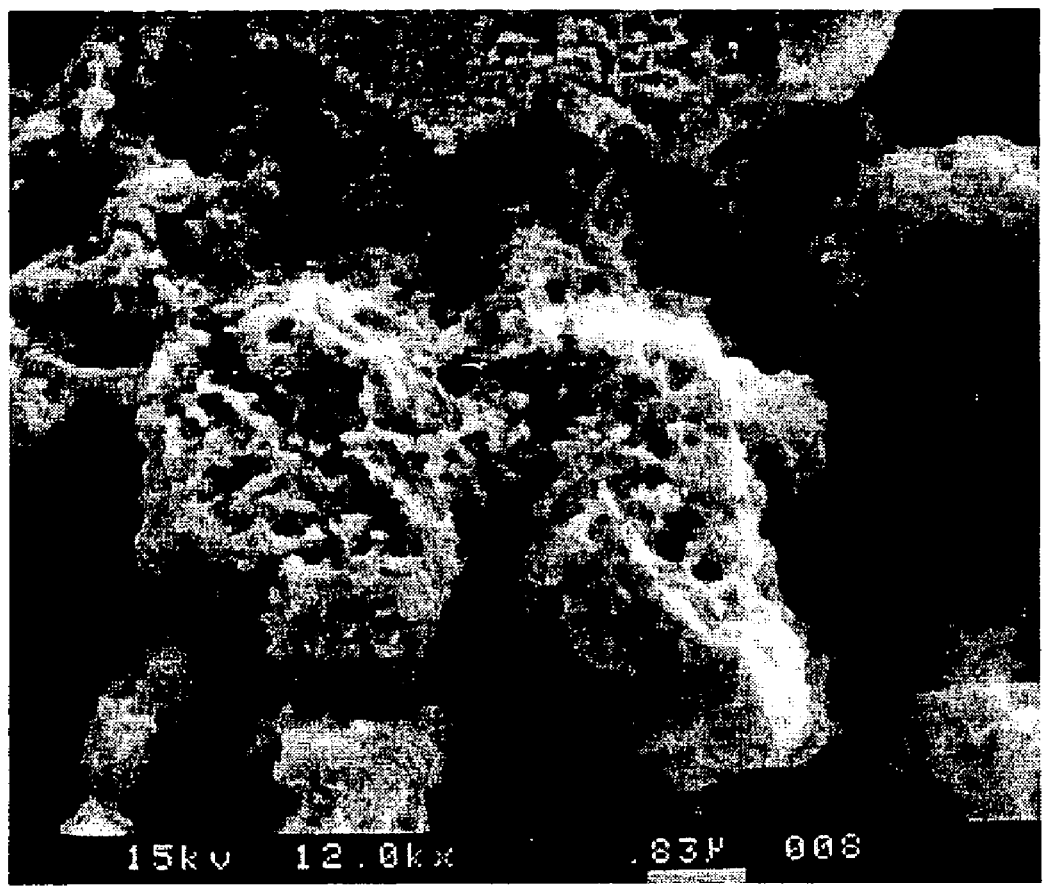
FIG. 4 is a photo of a copper surface treated by a first aqueous treatment solution according to the present invention as described in Example 2 having pits and dendritic structures at a magnification of about 11,000 times.

The semicrystalline structures are shown in FIG. 3 at a magnification of about 2,000 (1 cm corresponds to 5 microns). The pits and dendritic structures are shown in FIG. 4 at a magnification of about 11,000 (1 cm corresponds to 0.9 microns).

EXAMPLE 3

An aqueous solution was prepared by mixing the following components:

| | |
|---|---|
| sulfuric acid, 96% by weight | 50 ml |
| hydrogen peroxide, 35% by weight | 35 ml |
| 1H-1,2,3-triazolo [4,5-b] pyridine | 1.5 g |
| L-cystine | 0.1 g |
| Add up with deionized water to 1 liter. | |

The solution was heated to 35° C. for carrying out the method. A copper substrate which was prepared using CUPRACID® BL-CT was dipped into the solution for 50 seconds. After treatment the copper surfaces were rinsed with warm deionized water and then dried with hot air. The copper surface obtained was mat and had a pink color. The thickness of the copper layer etched off by means of the solution amounted to 0.85 microns. The microstructure of the copper surface exhibited two different structural dimensions; (1) semicrystalline structures were formed which had a structural size in the range of from 4–10 microns; (2) and deep pits with a size of from 300–500 nanometers were formed within the larger semicrystalline structures.

EXAMPLE 4

An aqueous solution was prepared by mixing the following components:

| | |
|---|---|
| sulfuric acid, 96% by weight | 50 ml |
| hydrogen peroxide, 35% by weight | 35 ml |
| 5-aminotetrazole | 2 g |
| L-cysteine | 0.2 g |
| Add up with deionized water to 1 liter. | |

The solution was heated to 35° C. for carrying out the method. A copper substrate which was prepared using CUPRACID® BL-CT was dipped into the solution for 50 seconds. After treatment the copper surfaces were rinsed with warm deionized water and then dried with hot air. The copper surface obtained was mat and had a pink color. The thickness of the copper layer etched off by means of the solution amounted to 0.85 microns. The microstructure of the copper surface exhibited two different structural dimensions; (1) semicrystalline structures were formed which had a structural size in the range of from 2–5 microns; (2) and dendritic structures with a size of from 50–500 nanometers were formed, superponding the larger semicrystalline structures.

A 25 microns thick photo-sensitive film was applied to the copper surface using standard processing parameters for the film. As a comparison, the same film was applied to a similar copper substrate that was treated with a common persulfate etching solution (80 g/L potassium persulfate, 30 ml/L sulfuric acid, 35° C., 60 seconds). The adhesion of the film was measured using a Romulus III Universal Tester manufactured by Quad Group. Ten measurements were taken for each substrate using studs with a contact area of 5.7 mm$^2$. The average adhesion force of the substrate treated according to the described method was 1931 N/cm$^2$, whereas the adhesion force measured on the substrate treated with persulfate was 1034 N/cm$^2$.

The invention claimed is:

1. Acid treatment liquid for the treatment of copper surfaces comprising:
   a. hydrogen peroxide and
   b. at least one five-membered heterocyclic compound
   wherein
   c. additionally at least one microstructure modifying agent is contained, selected from the group consisting of organic thiols, organic disulfides and organic sulfides, wherein the organic sulfides have the general formula

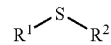

wherein
   $R^1$ and $R^2$=alkyl, alkenyl, aryl, aralkyl, cycloalkyl and the derivatives thereof.

2. Treatment liquid according claim 1, wherein the organic thiols have the general formula

A the organic disulfides have the general formula

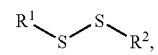

B wherein
   $R^1$ and $R^2$=alkyl, alkenyl, aryl, aralkyl, cycloalkyl and the derivatives thereof.

3. Treatment liquid according to any one of the preceding claims 1–2, wherein $R^1$ and $R^2$ contain a group mediating the solubility of the microstructure modifying agent in an aqueous solution.

4. Treatment liquid according to claim 3, wherein the functional group mediating the solubility of the microstructure modifying agent in an aqueous solution is selected from the group consisting of amino, carboxy and sulfo.

5. Treatment liquid according to any one of the preceding claims 1–2, wherein the at least one five-membered heterocyclic compound is selected from the group consisting of tetrazole and the derivatives thereof.

6. Treatment liquid according to claim 5, wherein the at least one five-membered heterocyclic compound is selected from the group consisting of 5-aminotetrazole and 5-phenyltetrazole.

7. Treatment liquid according to any one of the preceding claims 1–2, wherein the at least one microstructure modifying agent is selected from the group consisting of L-cysteine, DL-cysteine, 2-aminoethanethiol, mercaptoacetic acid, 3-mercapto-propionic acid, 2-mercaptoethanesulfonic acid, 3-mercaptopropanesulfonic acid, L-cystine, DL-cystine, D-cystine, bis-(2-aminoethyl) disulfide, dithiodiacetic acid, 3,3'-dithiodipropionic acid, 4,4'-dithiodibutyric acid, 3,3'-dithio-bis-(propanesulfonic acid), thiodiacetic acid, 3,3'-thiodipropionic acid, 3,3'-thio-bis-(propanesulfonic acid), thiobenzamide as well as the salts thereof.

8. Treatment liquid according to any one of the preceding claims 1–2, wherein at least one inorganic acid is contained.

9. Use of the acidic treatment liquid according to any one of the claims 1 to 2 for forming copper surfaces on printed circuit boards, the copper surfaces being suitable for the subsequent coating with plating resists, etch resists, solder masks and other dielectric films.

10. Method of treating copper surfaces comprising bringing into contact the copper surfaces with an acidic treatment liquid comprising
 a. hydrogen peroxide and
 b. at least one five-membered heterocyclic compound wherein
  c. additionally at least one microstructure modifying agent is contained, selected from the group consisting of organic thiols, organic disulfides and organic sulfides, wherein the organic sulfides have the formula

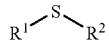

wherein
 $R^1$ and $R^2$=alkyl, alkenyl, aryl, aralkyl, cycloalkyl and the derivatives thereof.

11. Method according to claim 10, wherein the organic thiols have the general formula

A the organic disulfides have the general formula

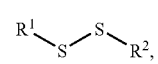

B wherein
 $R^1$ and $R^2$=alkyl, alkenyl, aryl, aralkyl, cycloalkyl and the derivatives thereof.

* * * * *

UNITED STATES PATENT AND TRADEMARK OFFICE
CERTIFICATE OF CORRECTION

| | |
|---|---|
| PATENT NO. | : 7,153,449 B2 |
| APPLICATION NO. | : 10/311395 |
| DATED | : December 26, 2006 |
| INVENTOR(S) | : Hauf et al. |

It is certified that error appears in the above-identified patent and that said Letters Patent is hereby corrected as shown below:

Column 1, line 11, delete "DE10043022.9" and replace with -- DE10034022.9--

Column 4, line 9, delete "pots" and replace with -- pits--

Column 6, line 4, delete "$C_3-_7$" and replace with -- $C_3-C_7$ --

Column 8, line 10, delete "micronx1" and replace with -- micron x 1--

Column 14, line 2, after the word "the" and before the word "formula" insert the word -- general--

Signed and Sealed this

Thirteenth Day of March, 2007

JON W. DUDAS
*Director of the United States Patent and Trademark Office*